(12) United States Patent
Fulford

(10) Patent No.: US 6,706,631 B1
(45) Date of Patent: Mar. 16, 2004

(54) METHOD OF CONTROLLING SHEET RESISTANCE OF METAL SILICIDE REGIONS BY CONTROLLING THE SALICIDE STRIP TIME

(75) Inventor: H. Jim Fulford, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 173 days.

(21) Appl. No.: 09/624,656

(22) Filed: Jul. 25, 2000

(51) Int. Cl.⁷ .......................................... H01L 21/302
(52) U.S. Cl. ...................... 438/689; 438/720
(58) Field of Search ............... 438/300, 655, 438/656, 682, 683, 689, 720, 721, 724, 745

(56) References Cited

U.S. PATENT DOCUMENTS

| | | | | |
|---|---|---|---|---|
| 4,657,628 A | * | 4/1987 | Holloway et al. | 438/647 |
| 4,663,191 A | * | 5/1987 | Choi et al. | 438/682 |
| 5,298,278 A | * | 3/1994 | Mifune | 427/8 |
| 5,723,377 A | * | 3/1998 | Torii | 438/303 |
| 5,844,684 A | * | 12/1998 | Maris et al. | 356/432 |
| 6,004,878 A | * | 12/1999 | Thomas et al. | 257/344 |
| 6,180,469 B1 | * | 1/2001 | Pramanick et al. | 438/299 |
| 6,218,249 B1 | * | 4/2001 | Maa et al. | 438/290 |
| 6,245,622 B1 | * | 6/2001 | Kawaguchi | 438/305 |

* cited by examiner

Primary Examiner—Kin-Chan Chen
(74) Attorney, Agent, or Firm—Williams, Morgan & Amerson

(57) ABSTRACT

A method of controlling the sheet resistance of metal silicide regions by controlling the salicide strip time is provided. In one illustrative embodiment, the method comprises forming a layer comprised of a refractory metal, determining a thickness of the layer of refractory metal, and converting a portion of the layer of refractory metal to a metal silicide. The method further comprises determining a duration of an etching process to be used to remove unreacted portions of the refractory metal layer based upon the determined thickness of the refractory metal layer, and performing the etching process for the determined duration.

23 Claims, 4 Drawing Sheets

METHOD OF CONTROLLING SHEET RESISTANCE OF METAL SILICIDE REGIONS BY CONTROLLING THE SALICIDE STRIP TIME

BACKGROUND OF THE INVENTION

1. Field of the Invention

This invention relates generally to semiconductor device manufacturing, and, more particularly, to a method of controlling sheet resistance of metal silicide regions by controlling the salicide strip time.

2. Description of the Related Art

The manufacture of most devices, such as semiconductor devices, requires a number of discrete processing steps to create the device. With respect to semiconductor devices, a number of discrete steps are needed to produce a packaged semiconductor circuit device from raw semiconductor material. The starting substrate is usually a slice of single crystal silicon referred to as a wafer. Circuits of a particular type are fabricated together in batches of wafers called "lots" or "runs." The fabrication process creates regular arrays of a circuit on the wafers of a lot. During processing, the individual wafers in a lot may go through individual processing steps one at a time or as a batch. At the completion of wafer processing, the wafers are tested to determine circuit functionality. Later, the wafers are cut to separate the individual integrated circuit devices, the functioning devices are packaged, and further testing is performed prior to use by the customer.

There is a constant drive within the semiconductor industry to increase the operating speed of integrated circuit devices, e.g. microprocessors memory devices, etc. This drive is fueled by consumer demands for computers and electronic devices that operate at increasingly greater speeds. By way of background, FIG. 1 depicts an illustrative NMOS field effect transistor 10 formed above a surface 14 of a semiconducting substrate 12 between trench isolation regions 25. The transistor 10 is comprised of a gate dielectric 16, a gate electrode 18, a plurality of sidewall spacers 20 and multiple source/drain regions 28. The transistor 10 is further comprised of metal silicide regions 21 formed on the source/drain regions 28 and on the gate electrode 18.

The purpose of the metal silicide regions 21 is to reduce the contact resistance of the source/drain regions 28 and the gate electrode 18. The metal silicide regions 21 are formed by depositing a layer of refractory metal, e.g., cobalt, titanium, etc., above the source/drain regions 28 and the gate electrode 18. Thereafter, by performing one or more anneal processes, portions of the refractory metal layer in contact with the source/drain regions 28 and the gate electrode 18 are converted to a metal silicide, e.g., cobalt silicide, titanium silicide, etc.

In the process of forming the metal silicide regions 21 above the source/drain regions 28 and above the gate electrode 18, there comes a point where unreacted portions of the initially-formed layer of refractory metal are removed. For example, in areas where the refractory metal layer is not in contact with polysilicon, e.g., the surface of the sidewall spacers 20, the refractory metal layer will not be converted to a metal silicide. This removal of the unreacted refractory metal layer is typically accomplished by a dilute acid bath, such as a bath comprised of sulfuric acid and hydrogen peroxide. During this process, portions of the previously formed metal silicide contacts 21 are removed. This, in turn, increases the sheet resistance of the contact, thereby making the operation of the device slower and less efficient, both of which are undesirable.

However, due to the construction of the device, it is imperative that no "bridging" material is left between the metal silicide regions formed above the source/drain regions 28 and the gate electrode 18. Otherwise, a short circuit path may be established that may severely hamper or prevent the functioning of this device. Thus, in an effort to insure that essentially all of the unreacted refractory metal is removed from places where it should not be, the removal process is designed for a "worst-case" situation. That is, the parameters of the removal process used to remove the unreacted refractory metal are set based upon the greatest thickness anticipated for the refractory metal, i.e., existing methods set the duration of the chemical removal process based upon the thickest layer of refractory metal that may be anticipated by the process. In situations where the layer of refractory metal is less than the maximum thickness anticipated by the design process, this results in subjecting the device to the etching process for a duration longer than would otherwise be required to remove the unreacted portions of the layer of refractory metal. In turn, this over-etching needlessly consumes some of the thickness of the metal silicide regions 21, which undesirably increases the sheet resistance of the metal silicide regions 21.

The present invention is directed to a method of forming a semiconductor device that minimizes or reduces some or all of the aforementioned problems.

SUMMARY OF THE INVENTION

The present invention is directed to a method of controlling the sheet resistance of metal silicide regions by controlling the salicide strip time. In one illustrative embodiment, the method comprises forming a layer comprised of a refractory metal, determining a thickness of the layer of refractory metal, and converting a portion of the layer of refractory metal to a metal silicide. The method further comprises determining a duration of an etching process to be used to remove unreacted portions of the refractory metal layer based upon the determined thickness of the refractory metal layer, and performing the etching process for the determined duration.

BRIEF DESCRIPTION OF THE DRAWINGS

The invention may be understood by reference to the following description taken in conjunction with the accompanying drawings, in which like reference numerals identify like elements, and in which.

Figure 1:
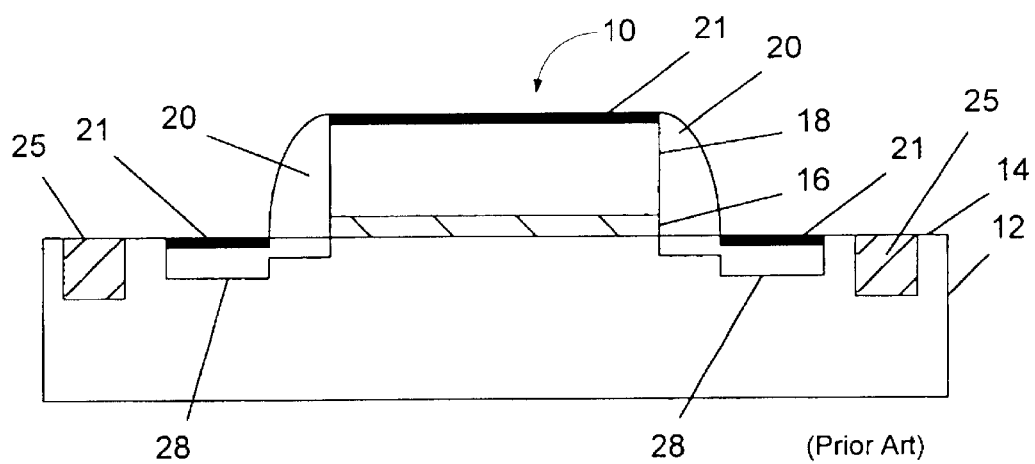
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–6. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of controlling the sheet resistance of metal silicide regions by controlling the salicide strip time. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2:
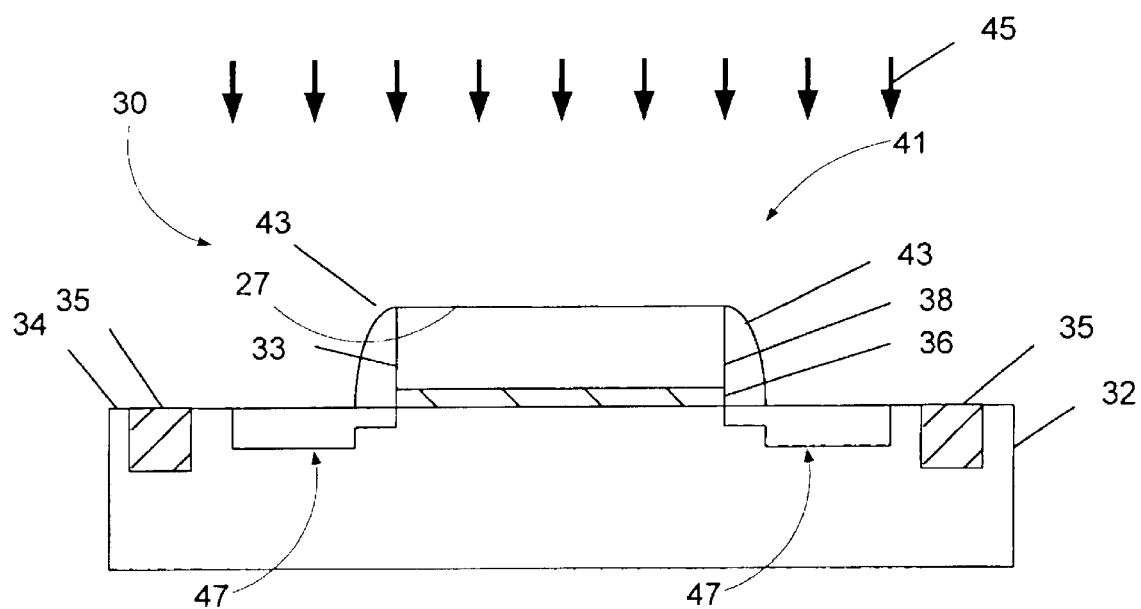
FIG. 2 is a cross-sectional view of a partially formed transistor.

As shown in FIG. 2, an illustrative NMOS field effect transistor 30 is formed above a surface 34 of a semiconducting substrate 32. Although the transistor 30 depicted in FIG. 2 is an NMOS transistor, the present invention is not limited to any particular technology. At this stage of fabrication, the transistor 30 is comprised of a gate insulation layer 36, a gate electrode 38, and sidewall spacers 43. In general, the particular materials and techniques used to form the various components and layers depicted in FIG. 2, e.g., the gate insulation layer 36 and the gate electrode 38, are matters of design choice, and, thus, should not be considered a limitation of the present invention. For example, the gate insulation layer 36 may be comprised of silicon dioxide, and it may be formed by thermal growth or deposition process. Similarly, the gate electrode layer 38 may be comprised of polysilicon, and it may be formed by a physical vapor deposition ("PVD") or a chemical vapor deposition ("CVD") process. In one illustrative embodiment, the gate electrode 38 is comprised of a layer of polysilicon having a thickness ranging from approximately 2000–4000 Å that is formed by a CVD process. The structure comprised of the gate insulation layer 36 and the gate electrode 38 may be formed by forming the various process layers for those components and thereafter patterning these layers using known photolithography and etching techniques.

The sidewall spacers 43 are formed adjacent the gate electrode 38 and the gate insulation layer 36. The sidewall spacers 43 may be formed by blanket-depositing a layer of spacer material (not shown) over the transistor 30, and thereafter performing an anisotropic etching process. As will be apparent to those skilled in the art upon a complete reading of the present application, the sidewall spacers 43 may be formed from any of a variety of materials, such as silicon dioxide, silicon nitride, etc. Moreover, although single sidewall spacers 43 are depicted in FIG. 2, the present invention may be used in situations where multiple sidewall spacers are formed adjacent each side 33 of the gate electrode 38.

Source/drain regions 47 are also formed in the substrate 32 by implanting dopant atoms, e.g., arsenic, boron, etc., into the substrate using one or more ion implantation processes. For example, prior to the formation of the sidewall spacer 43, the transistor 30 may be subjected to an ion implantation process with the appropriate dopant atoms at a relatively light doping concentration to form a relatively shallow dopant implant region (not shown) that is self-aligned with respect to the gate electrode 38. After formation of the sidewall spacers 43, the transistor 30 is then subjected to another ion implantation process to complete the formation of the source/drain regions 47 depicted in FIG. 2. The described process flow results in source/drain regions 47 having the familiar lightly-doped ("LDD") structure. Of course, the formation of source/drain regions 47 using the particular methods or processes described herein is not required to practice the present invention.

Figure 3:
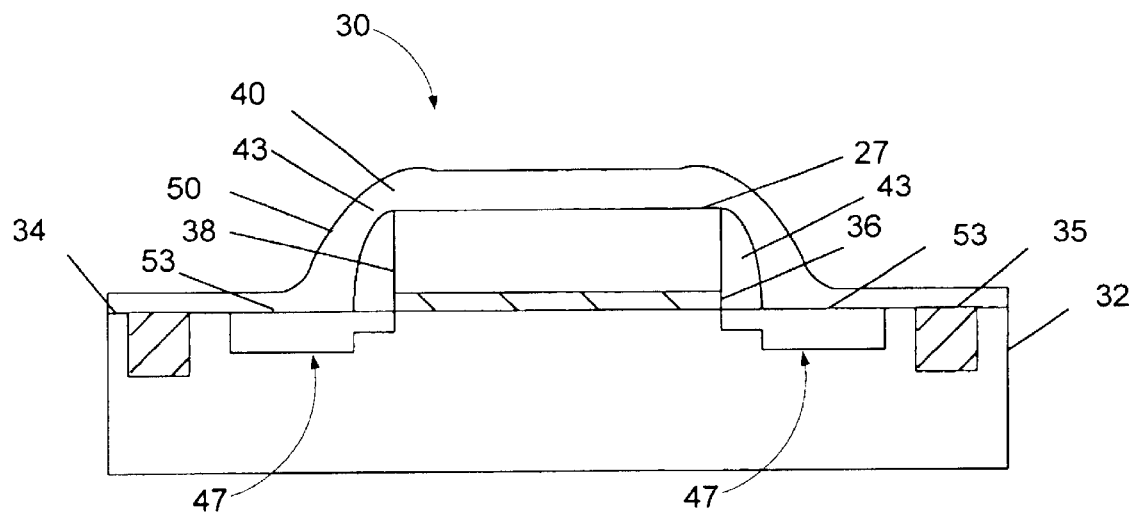
FIG. 3 is a cross-sectional view of the device shown in FIG. 2 after a layer of refractory metal has been formed thereabove.
Figure 4:
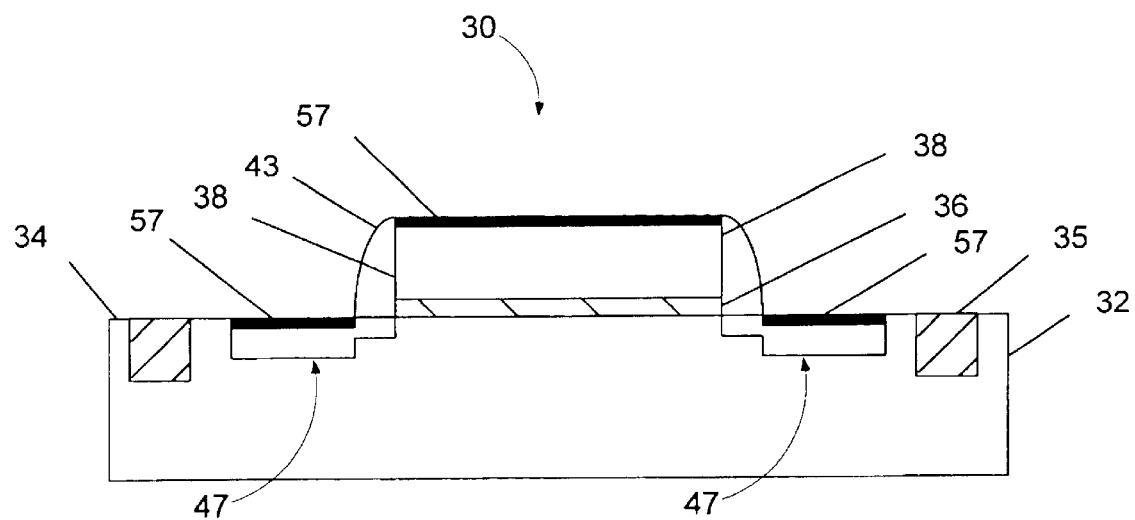
FIG. 4 is a cross-sectional view of the device shown in FIG. 3 after portions of the layer of refractory metal have been converted to a metal silicide.

Next, as shown in FIG. 3, a layer of refractory metal 40 may be formed above the gate electrode 38, the sidewall spacers 43, and a surface 53 of the source/drain regions 47. The layer of refractory metal 40 may be comprised of any metal that may subsequently be converted into a metal silicide. For example, the layer of refractory metal 40 may be comprised of cobalt, titanium, tantalum, platinum, nickel, or other like materials. The layer of refractory metal 40 may have a thickness ranging from approximately 50–200 Å, and it may be formed by any of a variety of known techniques for forming such layers, e.g., PVD, CVD, etc. In one illustrative embodiment, the layer of refractory metal 40 is comprised of cobalt having a thickness ranging from approximately 50–200 Å that is formed by a PVD process.

Thereafter, at least portions of the layer of refractory metal 40 are converted to metal silicide regions 57 by performing one or more anneal processes. In particular, during the anneal process, portions of the layer of refractory metal 40 in contact with the surface 53 of the source/drain regions 47 and a surface 27 of the gate electrode 38 are converted to metal silicide regions 57. Portions of the refractory metal layer 40 that are unreacted after this conversion process may be removed by a subsequent acid rinse, for example, $H_2O_2$ plus water, to result in the structure depicted in FIG. 4.

The particular parameters of the anneal process or processes used to form the metal silicide regions 57 are matters of design choice, and they may vary depending upon the device under construction as well as the thickness and composition of the layer of refractory metal 40. The anneal process may be comprised of a one-step or a two-step anneal process in a rapid thermal anneal chamber. The duration and temperatures of the anneal process may be varied as a matter of design choice to insure that the layer of refractory metal 40 reaches the appropriate temperature. In one illustrative example, where the layer of refractory metal 40 is comprised of approximately 50–200 Å of cobalt, the anneal process may be comprised of a first step at about 450–600° C. for a duration of approximately 10–90 seconds, and a second step at about 650–900° C. for a duration of approximately 10–90 seconds.

Figure 5:
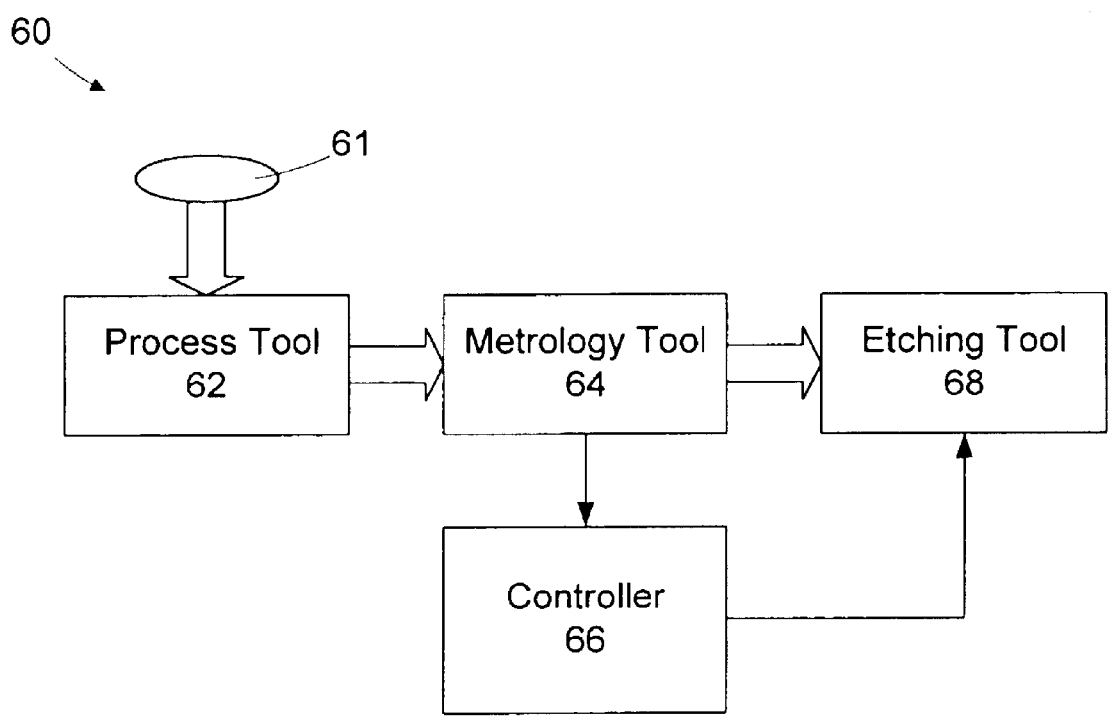
FIG. 5 is a depiction of an illustrative system that may be used with the present invention.

In one embodiment of the present invention, the process of removing the unreacted portions of the refractory metal layer 40 is adjusted, depending upon the thickness of the refractory metal layer 40. One illustrative system that may be used in accordance with the present invention is depicted in FIG. 5. As shown therein, a system 60 for processing wafers 61 is comprised of a process tool 62 used for forming the refractory metal layer 40, e.g., a deposition tool, a metrology tool 64, an automatic process controller 66, and an etch tool 68. The metrology tool 64 is used to measure the as formed thickness of the refractory metal layer 40.

In one embodiment, the automatic process controller 66 interfaces with the metrology tool 64 and the etch tool 68 to control the duration of the processing performed in the etch tool 68, depending upon the thickness of the refractory metal layer 40, as determined by the metrology tool 64. That is, the thickness of the refractory metal layer 40 is fed forward to the controller 66, and the resident time in the etch tool 68 is controlled based upon this measured thickness. For example, the greater the thickness of the refractory metal layer 40, the longer the resident time in the etch tool 68. Conversely, the thinner the refractory metal layer 40, the shorter the resident time in the etch tool 68.

The metrology tool 64 may be any type of device capable of measuring the thickness of such process layers, e.g., an acoustic wave metrology tool, such as the Metapulse tool manufactured by Rudolph. Another technique for measuring this thickness is known as Ruckerford back scattering (RBS). Moreover, the metrology tool 64 may be a stand-alone device or system, or it may be incorporated into the process tool 62, or a system containing both. The etch tool 68 is used to remove the unreacted portions of the refractory metal layer 40 after silicidation processing has been performed to form the various metal silicide regions 57 described above. The etch tool 68 may be comprised of a variety of wet etching systems useful for removing the unreacted portions of the refractory metal layer 40. Moreover, the particular etch chemistry used in the etch tool 68 may vary depending upon the device under construction as well as the material comprising the refractory metal layer 40.

In the illustrated embodiment, the automatic process controller 66 is a computer programmed with software to implement the functions described. However, as will be appreciated by those of ordinary skill in the art, a hardware controller (not shown) designed to implement the particular functions may also be used. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the automatic process controller 66, as described, is the Catalyst system offered by KLA Tencor. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 6:
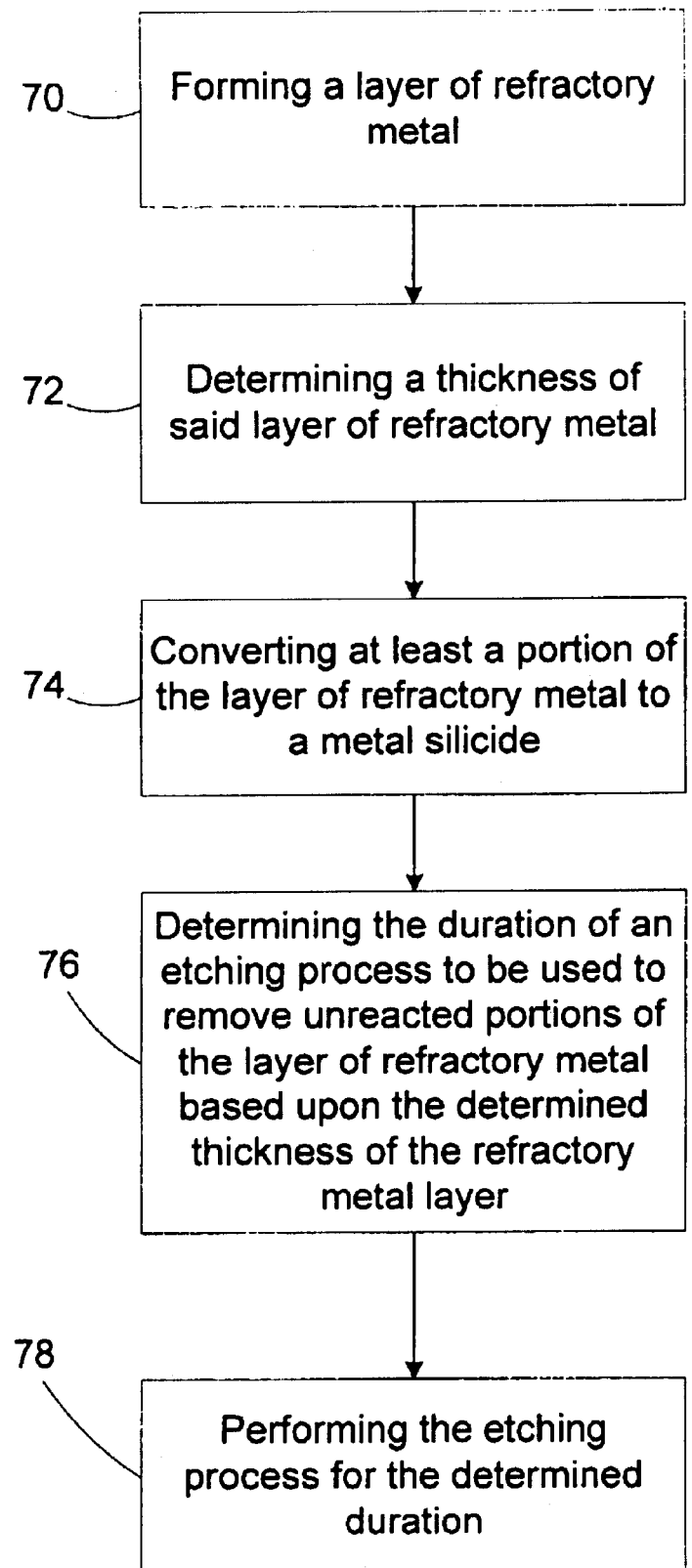
FIG. 6 is a flowchart depicting one illustrative embodiment of the inventive methods disclosed herein.

Referring now to FIG. 6, a flow diagram of a method for controlling the sheet resistance of metal silicide regions by controlling salicide strip time is provided. As depicted therein, the method comprises forming a layer comprised of a refractory metal, as indicated at block 70, and determining a thickness of the layer of refractory metal, as indicated at block 72. The method further comprises converting a portion of the refractory metal layer to a metal silicide, as indicated at block 74 determining the duration of a wet etching process to be used to remove unreacted portions of the layer of refractory metal based upon the determined thickness of the refractory metal layer, as indicated at block 76, and performing the etching process for the determined duration, as indicated at block 78.

As described above, the step of forming the layer of refractory metal, as recited at block 70, may be performed by any process tool useful for such purposes, e.g., a chemical vapor deposition ("CVD") tool, a physical vapor deposition ("PVD") tool, a plasma enhanced chemical vapor deposition ("PECVD") tool, etc. Moreover, the refractory metal layer formed during this step may be comprised of a variety of materials, e.g., cobalt, titanium, etc. The thickness of the layer of refractory metal may also be varied as a matter of design choice.

Similarly, the thickness of the refractory metal layer 40 may be determined using any tool suitable for such purposes. Moreover, this thickness determination may be based on a single or multiple measurements, it may represent a mean or median of a group of measurements, or it may otherwise reflect statistical sampling of a sufficient quantity and at sufficient locations to provide a degree of reliability as to its accuracy that is sufficient for use in the present invention.

The step of converting a portion of the refractory metal layer to a metal silicide, as set forth at block 74, may be accomplished by performing one or more anneal steps in the appropriate process tool, e.g., a rapid thermal anneal chamber. The exact parameters of the anneal process or processes may vary depending upon the device under construction and the materials comprising the refractory metal layer 40. Thus, the illustrative anneal processes described herein should not be considered a limitation of the present invention.

As set forth in block 76, the step of determining the duration of the etching process to remove the unreacted portions of the refractory metal layer based upon the determined thickness of the refractory metal layer may be performed by a variety of techniques. For example, a database may be developed that correlates the determined thickness of the refractory metal layer to a corresponding etch duration, depending upon the composition and concentrations of the components of the etch bath. Alternatively, the etch duration could be calculated based upon a known etch rate of the material comprising the refractory metal layer and its thickness. Other methodologies are also possible. Thereafter, as indicated at block 78, the method continues with performing the etch process for the determined time period to remove the unreacted portion of the refractory metal layer 40.

Through use of the present invention, the sheet resistance of the metal silicide regions on a semiconductor device may be controlled by controlling the salicide strip time. The present invention may be used to reduce or eliminate excessive consumption of metal silicide regions during salicide stripping operations. This will, in turn, help prevent the increase in the sheet resistance of the regions, thereby helping to insure device integrity and performance.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method comprising:
   forming a layer comprised of a refractory metal;
   determining a thickness of said layer of refractory metal;
   converting a portion of said layer of refractory metal to a metal silicide;
   determining a duration of an etching process to remove unreacted portions of said refractory metal layer based upon said determined thickness of said refractory metal layer; and
   performing said etching process for said determined duration to remove said unreacted portions of said refractory metal layer.

2. The method of claim 1, wherein forming a layer comprised of a refractory metal comprises depositing a layer comprised of a refractory metal.

3. The method of claim 1, wherein forming a layer comprised of a refractory metal comprises forming a layer comprised of a refractory metal comprised of at least one of cobalt, titanium, tantalum and nickel.

4. The method of claim 1, wherein forming a layer comprised of a refractory metal comprises forming a layer comprised of a refractory metal above a plurality of source/drain regions and a gate electrode of a transistor.

5. The method of claim 1, wherein determining a thickness of said layer of refractory metal comprises determining a thickness of said layer of refractory metal based upon a single measurement of said layer of refractory metal.

6. The method of claim 5, wherein determining the thickness of said layer of refractory metal based upon the single measurement of said layer of refractory metal comprises determining the thickness of said layer of refractory metal based upon the single measurement of said layer of refractory metal performed by a metrology tool.

7. The method of claim 1, wherein determining a thickness of said layer of refractory metal comprises determining a thickness of said layer of refractory metal based upon multiple measurements of said layer of refractory metal.

8. The method of claim 7, wherein determining the thickness of said layer of refractory metal based upon multiple measurements of said layer of refractory metal comprises determining the thickness of said layer of refractory metal based upon multiple measurements of said layer of refractory metal performed by a metrology tool.

9. The method of claim 1, wherein determining a thickness of said layer of refractory metal comprises determining an average thickness of said layer of refractory metal.

10. The method of claim 1, wherein converting a portion of said layer of refractory metal to a metal silicide comprises performing at least one anneal process to convert a portion of said layer of refractory metal to a metal silicide.

11. The method of claim 1, wherein converting a portion of said layer of refractory metal to a metal silicide comprises performing at least two anneal processes to convert a portion of said layer of refractory metal to a metal silicide.

12. The method of claim 1, wherein determining a duration of an etching process to remove unreacted portions of said refractory metal layer based upon said determined thickness of said refractory metal layer comprises calculating a duration of an etching process to remove unreacted portions of said refractory metal layer based upon said determined thickness of said refractory metal layer.

13. The method of claim 1, wherein determining a duration of an etching process to remove unreacted portions of said refractory metal layer based upon said determined thickness of said refractory metal layer comprises selecting a duration of an etching process to remove unreacted portions of said refractory metal layer from a database that correlates the duration of the etching process to said determined thickness of said refractory metal layer.

14. A method comprising:
   depositing a layer comprised of a refractory metal above a plurality of source/drain regions and a gate electrode of a transistor;
   determining a thickness of said layer of refractory metal;
   converting a portion of said layer of refractory metal to a metal silicide by performing at least one anneal process;
   determining a duration of an etching process to remove unreacted portions of said refractory metal layer based upon said determined thickness of said refractory metal layer; and
   performing said etching process for said determined duration to remove said unreacted portions of said refractory metal layer.

15. The method of claim 14, wherein depositing a layer comprised of a refractory metal comprises depositing a layer comprised of a refractory metal comprised of at least one of cobalt, titanium, tantalum and nickel.

16. The method of claim 14, wherein determining a thickness of said layer of refractory metal comprises determining a thickness of said layer of refractory metal based upon a single measurement of said layer of refractory metal.

17. The method of claim 16, wherein determining the thickness of said layer of refractory metal based upon the single measurement of said layer of refractory metal comprises determining the thickness of said layer of refractory metal based upon the single measurement of said layer of refractory metal performed by a metrology tool.

18. The method of claim 14, wherein determining a thickness of said layer of refractory metal comprises determining a thickness of said layer of refractory metal based upon multiple measurements of said layer of refractory metal.

19. The method of claim 18, wherein determining the thickness of said layer of refractory metal based upon multiple measurements of said layer of refractory metal comprises determining the thickness of said layer of refractory metal based upon multiple measurements of said layer of refractory metal performed by a metrology tool.

20. The method of claim 14, wherein determining a thickness of said layer of refractory metal comprises determining an average thickness of said layer of refractory metal.

21. The method of claim 14, wherein converting a portion of said layer of refractory metal to a metal silicide by performing at least one anneal process comprises converting a portion of said layer of refractory metal to a metal silicide by performing at least two anneal processes.

22. The method of claim 14, wherein determining a duration of an etching process to remove unreacted portions of said refractory metal layer based upon said determined thickness of said refractory metal layer comprises calculating a duration of an etching process to remove unreacted portions of said refractory metal layer based upon said determined thickness of said refractory metal layer.

23. The method of claim 14, wherein determining a duration of an etching process to remove unreacted portions of said refractory metal layer based upon said determined thickness of said refractory metal layer comprises selecting a duration of an etching process to remove unreacted portions of said refractory metal layer from a database that correlates the duration of the etching process to said determined thickness of said refractory metal layer.

* * * * *